United States Patent
Watanabe et al.

(10) Patent No.: US 7,559,041 B2
(45) Date of Patent: Jul. 7, 2009

(54) METHOD AND APPARATUS FOR DESIGNING SEMICONDUCTOR INTEGRATED CIRCUIT

(75) Inventors: Kenichi Watanabe, Tagajo (JP); Takashi Kumazaki, Sendai (JP); Akira Shoji, Sendai (JP)

(73) Assignee: Freescale Semiconductor, Inc, Austin, TX (US)

( * ) Notice: Subject to any disclaimer, the term of this patent is extended or adjusted under 35 U.S.C. 154(b) by 336 days.

(21) Appl. No.: 11/559,731

(22) Filed: Nov. 14, 2006

(65) Prior Publication Data

US 2007/0113213 A1   May 17, 2007

(30) Foreign Application Priority Data

Nov. 17, 2005   (JP) .............................. 2005-332851

(51) Int. Cl.
*G06F 17/50* (2006.01)
(52) U.S. Cl. ...................... 716/4; 716/1; 716/6; 716/13
(58) Field of Classification Search ...................... 716/1, 716/4, 6, 13
See application file for complete search history.

(56) References Cited

U.S. PATENT DOCUMENTS

2002/0073369 A1*   6/2002   How et al. .................. 714/724

FOREIGN PATENT DOCUMENTS

| JP | 08077227 A | 3/1996 |
|----|------------|--------|
| JP | 2001044287 A | 2/2001 |

* cited by examiner

*Primary Examiner*—Thuan Do
(74) *Attorney, Agent, or Firm*—Charles Bergere

(57) ABSTRACT

A flip flop device, a semiconductor integrated circuit, and a method and apparatus for designing a semiconductor integrated circuit that prevents timing violations while preventing the circuit scale from increasing. A flip flop including first, second, and third latch circuits is stored as a standard cell in a cell library of a designing apparatus. The output of the second latch circuit becomes a first output signal of the flip flop. The second latch circuit provides the third latch circuit with a signal generated by latching a data signal with a clock signal. An output of the third latch circuit becomes a second output signal of the flip flop. When an error path having the possibility of a hold time violation is found, output of the flip flop in a former stage is changed from the first output to the second output in the error path.

4 Claims, 4 Drawing Sheets

METHOD AND APPARATUS FOR DESIGNING SEMICONDUCTOR INTEGRATED CIRCUIT

BACKGROUND OF THE INVENTION

The present invention relates to a flip flop device, a semiconductor integrated circuit, and a method and apparatus for designing a semiconductor integrated circuit.

Gate array design and standard cell design are known procedures for designing semiconductor integrated circuit devices. In the gate array designing procedure, cells are arranged beforehand at predetermined positions and only wiring is performed. This procedure limits design freedom, but simplifies the design procedure.

In the standard cell designing procedure, circuits having certain functions and referred to as cells are prepared and arranged to form a circuit. As compared to the gate array design process, the standard cell design process achieves higher integration and increased functionality. Thus, the standard cell design process is used for designing a system on chip (SOC). In such a design process, a functional block diagram is first generated. Then, a detailed functional description is generated using a hardware description language. The detailed functional description undergoes functional testing with a functional simulator. For logic design, the functional block diagram and the detailed functional description are converted to specific hardware to generate a logic diagram (net list).

Next, layout is performed, where a circuit diagram is generated until a level enabling pattern of the logic expressed in the net list is generated. Then, a mask is generated to wire and connect devices of the circuit diagram on the semiconductor substrate.

In an actual LSI formed on a semiconductor substrate using the above process, circuits such as a flip flop that operates in accordance with a clock do not function normally unless setup and hold times are satisfactory. The setup time refers to the time during which a specified data signal is added and maintained before another input signal (clock signal) changes. The hold time refers to the time during which a specified data signal must be held after another input signal (clock signal) changes.

For example, in a logic LSI, wire delay is caused by wire resistance, wire capacitance, load capacitance, and the like. A delay is also produced when a signal passes through a logic gate. When a data delay or clock delay occurs due to such wire delay or logic gate delay, normal synchronous operations of flip flops are hindered. This may result in timing violations, such as setup time violations and data hold violations.

Therefore, in conventional circuit design processes, during logic design, wire delays that may actually occur are predicted after lay out. Then, timing analysis is performed based on the predicted wire delay, to determine where timing violations may occur so that changes may be made to the circuitry to satisfy the required timings.

Such an example will now be described with reference to FIG. 6. As shown in FIG. 6, a flip flop FF for use in a logic circuit includes two latch circuits (L1 and L2). A clock signal CK is used to generate an output signal Q from a data signal D.

In a circuit including two or more flip flops, with a clock tree synthesis (CTS) of a common clock source, a clock signal is synchronously provided to each flip flop FF from a clock generation circuit.

However, when cross talk noise enters a clock signal line, the clock signal provided to a flip flop FF in a latter stage may be delayed. In such a case, the output signal Q of a flip flop FF in a former stage is provided to a flip flop FF in a latter stage before the clock signal. This may cause a hold time violation.

Japanese Laid-Open Patent Publication No. 8-77227 (FIG. 1) discloses a technique for avoiding such a timing violation. In this technique, when designing the layout of an integrated circuit such as a gate array or a standard cell, devices are laid out so that deficiencies related with cross skew or hold time do not occur. More specifically, the number of gate circuits inserted in data signal paths between flip flops is counted. Flip flops for paths having a relatively large number of gate circuits are laid out near one another. Flip flops for paths having a relatively small number of gate circuits are laid out distant from one another.

To eliminate hold time violations, as shown in FIG. 7, the output terminal of a flip flop FF in a former stage is connected to the input terminal of a flip flop FF in a latter stage via plural stages of buffers B in accordance with a delay. This enables adjustment of the timing of the clock signal CK and the data signal D provided to the subsequent stage flip flop FF.

Japanese Laid-Open Patent Publication No. 2001-44287 (FIG. 1) discusses a method for designing a semiconductor integrated circuit that prevents hold time violations while enabling higher integration. In the technique described in this publication, when logic synthesizing is performed, restrictions are not applied for hold time violations but are applied for setup time violations. Timing analysis of a net list is performed. When a hold time violation is located in a path between flip flops FF, the flip flops FF are replaced by a correction flip flop FF unit. The correction flip flop FF unit includes delay circuits connected in front of a data input terminal and behind a data output terminal. Further, the correction flip flop FF unit is registered in a library in a unitized state with a minimized cell area.

The delay time differs depending on the circuit layout or the like. Thus, delay circuits (buffers) may not be able to avoid hold time violations. Further, the insertion of delay circuits depending on the circumstances makes circuit designing difficult. The insertion of such buffers or inverters increases the cell area and causes the wiring to be dense. In such a case, designing may physically become impossible.

Particularly, in a deep submicron process of 130 nm or less, setup time violations may be eliminated. However, the finer wires may increase the hold time violations. In the deep submicron process, the propagation delay of a clock signal due to cross talk noise or a decrease in the power supply voltage becomes prominent. Such clock fluctuation worsens skew and causes serious hold time violations. Further, since the hold time is not dependent on frequency, the problem of hold time violations cannot be solved by lowering the frequency. Thus, there is a possibility that abnormal functioning will occur.

SUMMARY OF THE INVENTION

The present invention provides a flip flop function device, a semiconductor integrated circuit, and a method and apparatus for designing a semiconductor integrated circuit that prevent hold time violations while enabling higher integration.

One aspect of the present invention is a flip flop function device including a flip flop forming means for receiving a clock signal and a data signal. A latch forming means receives the clock signal and an output signal of the flip flop forming means. A first output terminal outputs a signal from the flip flop forming means. A second output terminal outputs a signal from the latch forming means.

A further aspect of the present invention is a semiconductor integrated circuit including a flip flop function device having a flip flop forming means for receiving a clock signal and a data signal. A latch forming means receives the clock signal and an output signal of the flip flop forming means. A first output terminal outputs a signal from the flip flop forming means. A second output terminal outputs a signal from the latch forming means. The semiconductor integrated circuit is connected to a latter stage device that receives the clock signal and an output signal of the flip flop function device. The second output terminal is connected to the latter stage device for a data path having the possibility of causing a hold time violation in the latter stage device.

Another aspect of the present invention is a method for designing a semiconductor integrated circuit using pattern data for a flip flop function device including a flip flop forming means for receiving a clock signal and a data signal. A latch forming means receives the clock signal and an output signal of the flip flop forming means. A first output terminal outputs a signal from the flip flop forming means. A second output terminal outputs a signal from the latch forming means. The method includes the steps of designing a circuit by forming a data path with the first output terminal, inspecting hold time in a latter stage device of the data path, and connecting the latter stage device to the second output terminal instead of the first output terminal when found in the inspection that there is a possibility of occurrence of a hold time violation.

A further aspect of the present invention is an apparatus for designing a semiconductor integrated circuit using pattern data for a flip flop function device including a flip flop forming means for receiving a clock signal and a data signal. A latch forming means receives the clock signal and an output signal of the flip flop forming means. A first output terminal outputs a signal from the flip flop forming means. A second output terminal outputs a signal from the latch forming means. The apparatus includes a design processing means for designing a circuit by forming a data path with the first output terminal, a hold time inspecting means for inspecting hold time in a latter stage device of the data path, and a data path correcting means for connecting the latter stage device to the second output terminal instead of the first output terminal when found in the inspection that there is a possibility of occurrence of a hold time violation.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
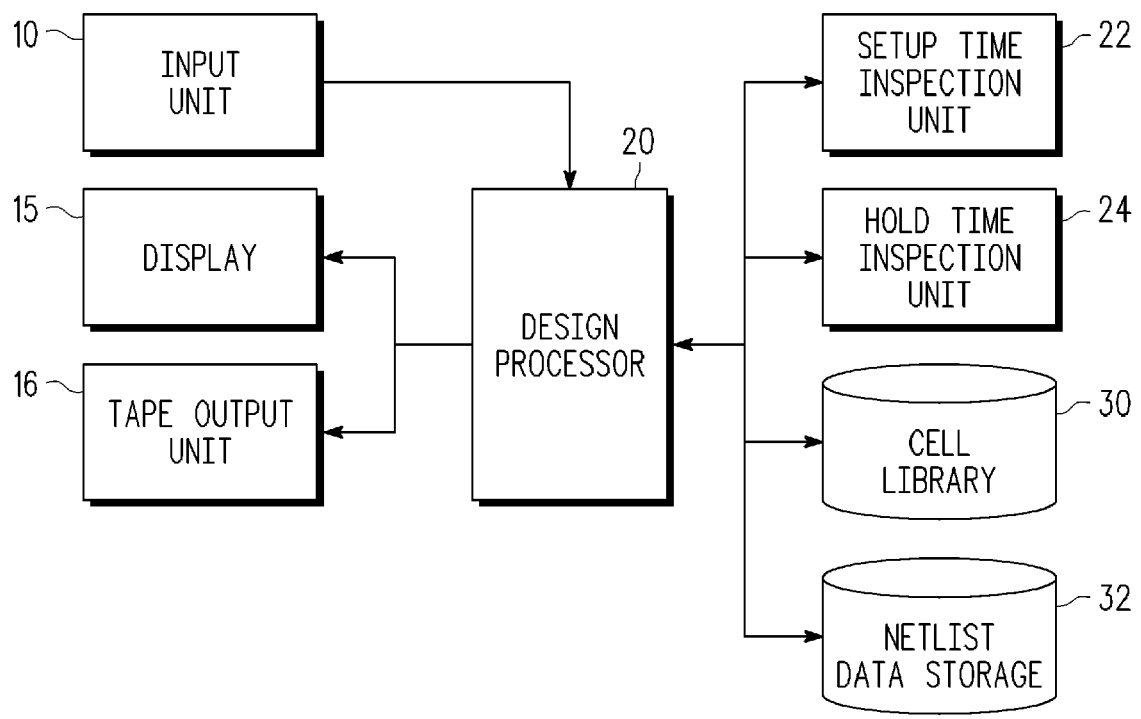
FIG. 1 is a block diagram of a circuit designing apparatus according to a preferred embodiment of the present invention.

A preferred embodiment of the present invention will now be described with reference to the drawings. FIG. 1 is a block diagram schematically showing the structure of a designing apparatus. The designing apparatus includes design processor 20, which is connected to an input unit 10, a display 15, and a tape output unit 16. The input unit 10 receives operation inputs of an operator. The display 15 displays each operation of the design processor 20. Further, data related to a completed circuit design diagram is output to the tape output unit 16.

The design processor 20, which functions as a design processing means and a data path correcting means, manages the operations of a hold time inspection unit 24 functioning as a hold time inspecting means, a net list data storage 32, and a cell library 30.

The setup time inspection unit 22 and the hold time inspection unit 24 each perform a simulation on a circuit layout generated from a net list to calculate the setup time or hold time and check whether there are no timing violations.

The cell library 30 is a data storing means for storing information related with a standard cell (basic device forming a semiconductor integrated circuit) used in this designing procedure. A standard cell includes a logic operator or a flip flop. The cell library 30 stores the area of the logic operator or flip flop and stores delay information of each cell and restriction information related with the setup time and the hold time.

Figure 2:
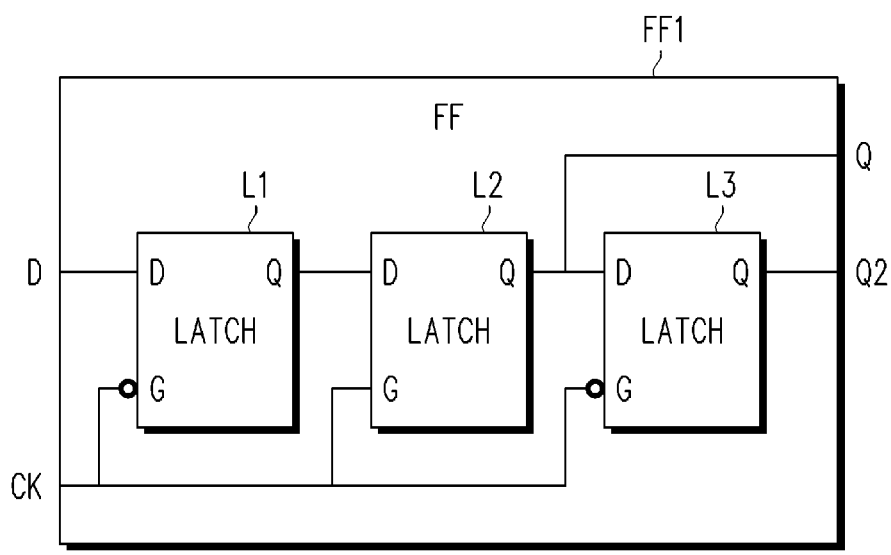
FIG. 2 is a circuit diagram of a flip flop in the preferred embodiment.

Referring to FIG. 2, the cell library 30 of the preferred embodiment records pattern data related with a flip flop FF1 functioning as a flip flop function device. The flip flop FF1 includes three latch circuits L1, L2, and L3. A clock signal CK, which is inverted, is input to the latch circuits L1 and L3. The two latch circuits L1 and L2 function as a flip flop forming means, and the latch circuit L3 functions as a latch forming means.

A data signal D to the flip flop FF1 is input to the latch circuit L1, and an output signal Q, which is latched by the clock signal CK, is provided to the latch circuit L2. The output of the latch circuit L2 becomes the output signal Q output from a first output terminal of the flip flop FF1. The data signal D of the latch circuit L2 is latched by the clock signal CK and provided as an output signal Q to the latch circuit L3. The output of the latch circuit L3 becomes the output signal Q2 output from a second output terminal of the flip flop FF1.

Figure 3:
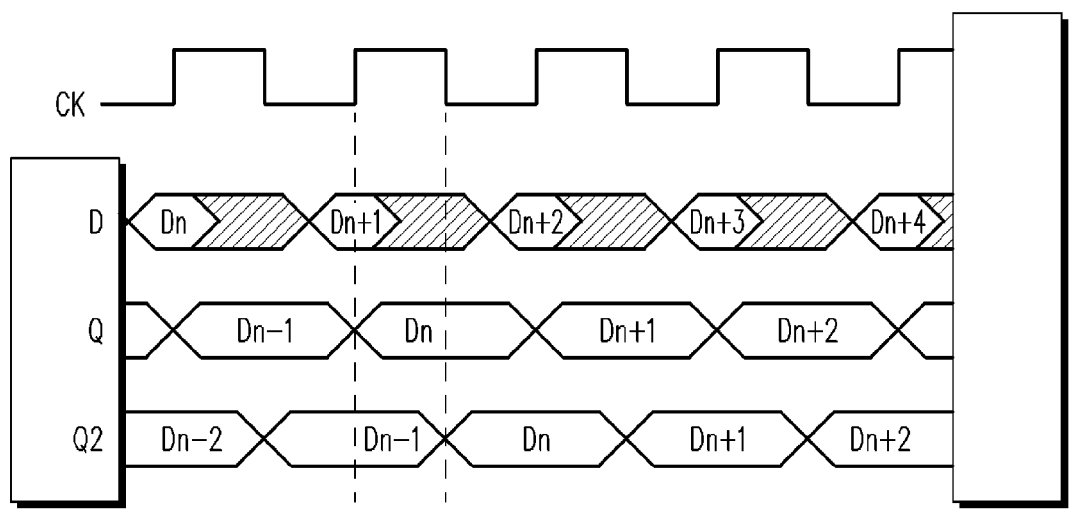
FIG. 3 is a timing chart of the flip flop.

FIG. 3 shows a timing chart of the flip flop FF1. The output signal Q of the flip flop FF1 changes whenever the clock signal CK rises and outputs the previous data signal. The output signal Q2 of the flip flop FF1 changes whenever the clock signal CK falls and outputs the previous data signal. Thus, the output signal Q2 is delayed from the output signal Q by one half of a cycle.

The net list data storage 32 is a data storing means for storing data related to the function and structure of a semiconductor integrated circuit described in hardware description language (HDL). The net list has a hierarchical structure and includes a net list in each functional block and a net list between functional blocks.

The design processor 20 uses the devices registered in the cell library 30 to generate circuit designing data at a gate level based on the data stored in the net list data storage 32. The circuit designing data is provided to the hold time inspection unit 24 and the setup time inspection unit 22.

The hold time inspection unit 24 and the setup time inspection unit 22 analyzes the structure of each logic circuit represented by the circuit designing data and all of the connection information between the logic circuits.

Figure 4:
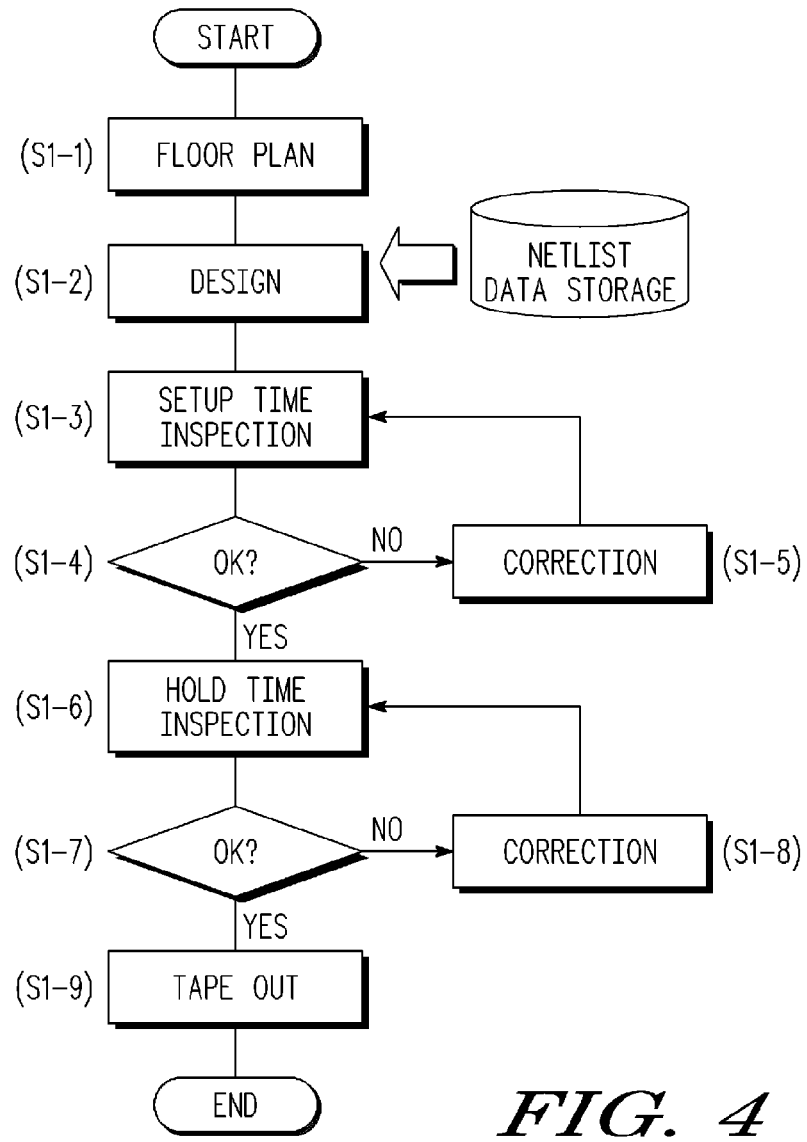
FIG. 4 is a flowchart showing the designing procedures in the preferred embodiment.

A method for analyzing and correcting timing in a semiconductor integrated circuit will now be discussed with reference to the flowchart of FIG. 4.

The layout (floor plan) of a power supply and a large scale functional block (memory, analog circuit, etc.) is first generated (step S1-1). The generation of the floor plan is executed based on instructions from the input unit 10.

Next, based on the generated floor plan, the design processor 20 executes a designing process (step S1-2). The design processor 20 performs circuit designing by wiring each cell based on the data stored in the net list data storage 32.

Figure 5A:
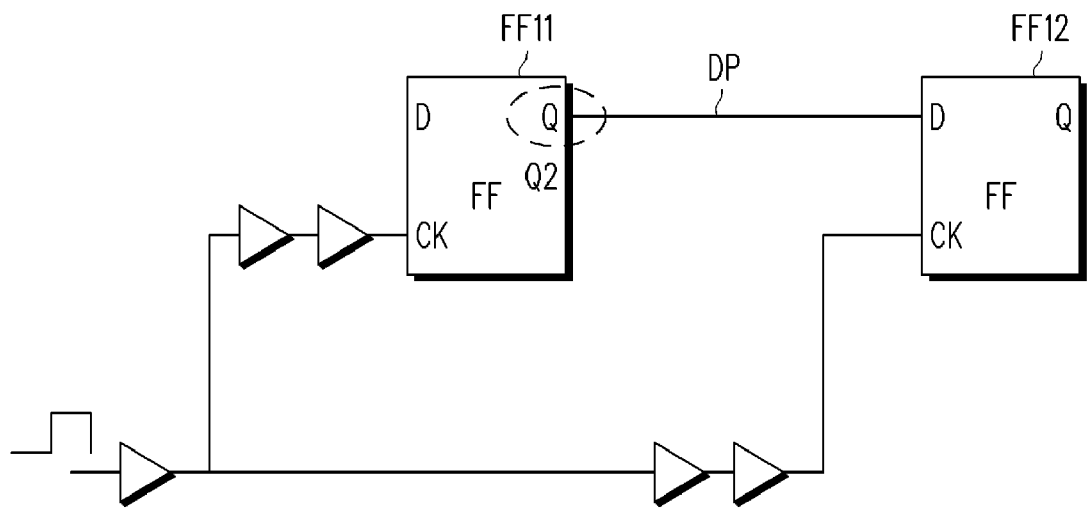
FIG. 5A is a circuit diagram showing the connection of flip flops in the preferred embodiment.

An example will be described with reference to FIG. 5A. In FIG. 5A, a flip flop FF11, which functions as a former stage device, has an output terminal connected to an input terminal of a flip flop FF12, which functions as a latter stage device. The flip flops FF11 and FF12 are synchronized with the rising or falling of a clock signal CK. The connection between the flip flops FF11 and FF12 provides the output signal Q of the former stage flip flop FF11 as the data signal D to the latter stage flip flop FF12.

Next, an inspection process of the setup time is performed (step S1-3). The setup time inspection unit 22 performs inspections using restrictions related with setup time violations. More specifically, the setup time inspection unit 22 predicts wiring delays that would actually occur and performs timing analysis based on the wiring delays. This locates data paths which may cause setup time violations.

When a data path having the possibility of causing a setup time violation (error path) is found (in step S1-4, NO), the setup time inspection unit 22 provides the design processor 20 with an inspection result. The inspection result includes information for locating an error path.

In this case, the design processor 20 performs a correction to satisfy the timings required for the setup time (step S1-5). More specifically, the design processor 20 carries out, for example, a logic compression procedure, to perform corrections that reduce the number of logic gate stages in a data path having the possibility of a setup time violation. In this manner, steps S1-3 to S1-5 are repeated until error paths having the possibility of a setup time violation are eliminated.

When the possibility of a setup time violation is eliminated (in step S1-4, YES), a hold time inspection process is performed (step S1-6). The hold time inspection unit 24 performs inspections using restrictions related with hold time violations. More specifically, the hold time inspection unit 24 predicts wiring delays that would actually occur and performs timing analysis based on the wiring delays. This locates data paths which may cause hold time violations.

When a data path having the possibility of a hold time violation (error path) is found (in step S1-7, NO), the hold time inspection unit 24 provides the design processor 20 with an inspection result. The inspection result includes information for locating an error path.

Figure 5B:
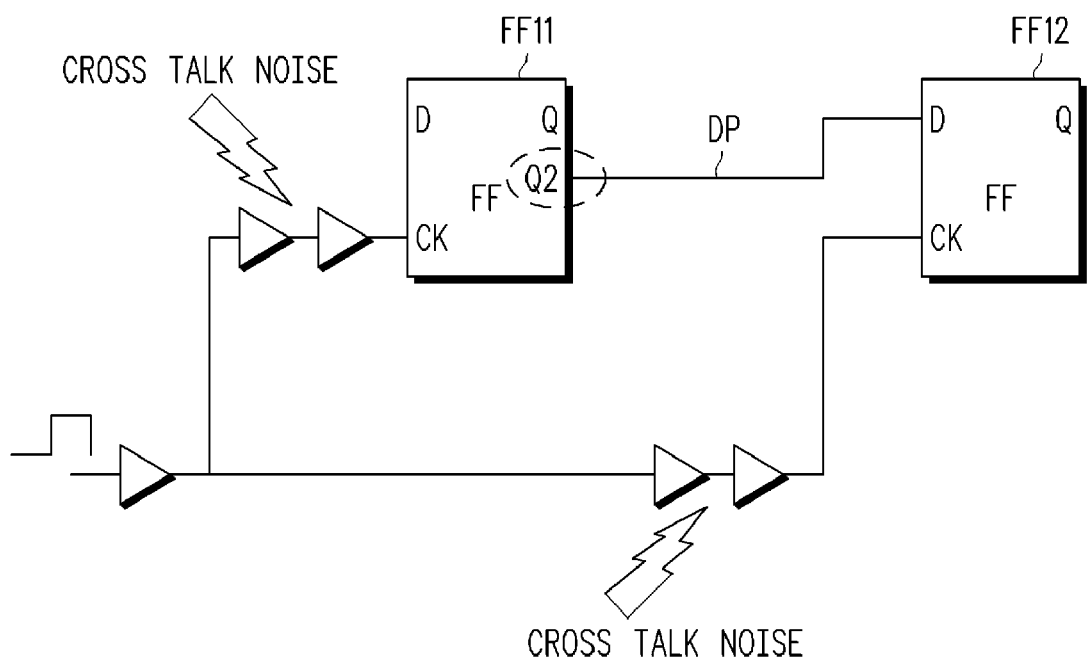
FIG. 5B is a circuit diagram showing the connection of flip flops subsequent to correction.
Figure 6:
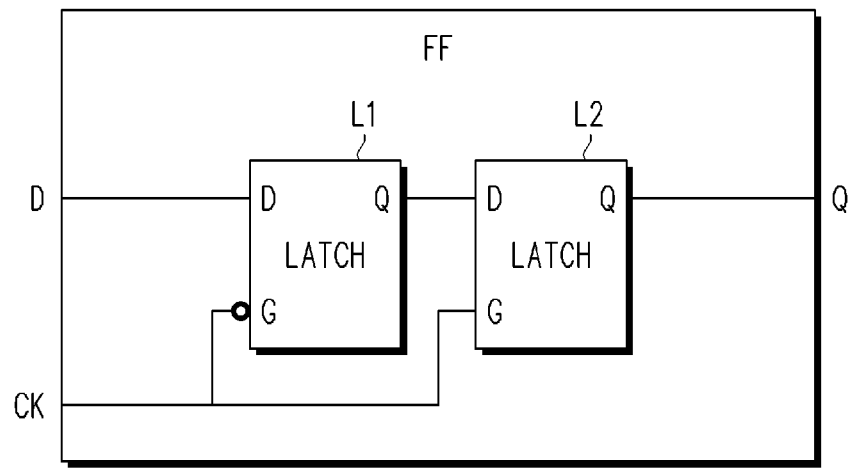
FIG. 6 is a circuit diagram showing the structure of a conventional flip flop.
Figure 7:
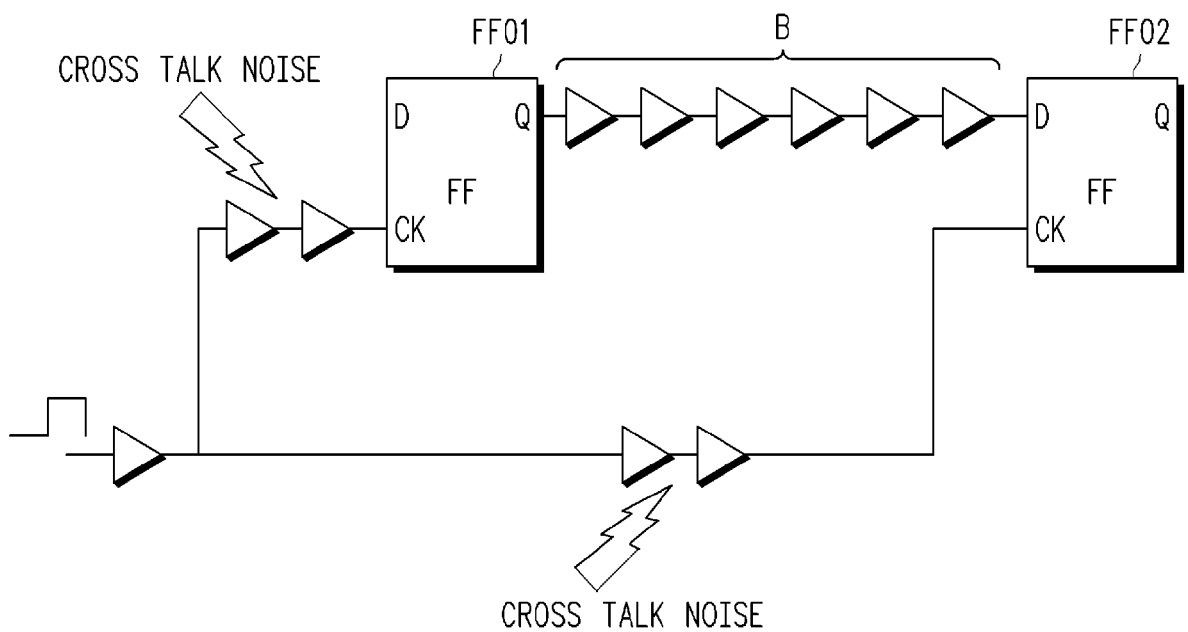
FIG. 7 is a circuit diagram showing the connection of a conventional flip flop.

In this case, the design processor 20 performs a correction to satisfy the timings required for the hold time (step S1-8). More specifically, the design processor 20 changes the output of the former stage flip flop FF from a Q output to a Q2 output. This correction will be described with reference to FIG. 5B. As shown in FIG. 5B, when there is a possibility of a hold time violation occurring in path DP, the output terminal of the flip flop FF11 is changed from a Q output to a Q2 output. In this manner, steps S1-6 to S1-8 are repeated until error paths having the possibility of a hold time violation are eliminated.

When hold time violations are eliminated (in step S1-7, YES), the design processor 20 performs a tape out process (step S1-9). This generates mask data used for the manufacturing of an LSI.

The preferred embodiment has the advantages described below.

In the preferred embodiment, circuit designing is performed using the flip flop FF1, which includes the three latch circuits L1, L2, and L3. Due to the three latch circuits, the flip flop FF1 outputs the normal output signal Q and the output signal Q2, which is delayed from the output signal Q by one half of a cycle. Thus, just by changing the Q output to the Q2 output, sufficient delay is ensured in an error path having a hold time violation.

In the preferred embodiment, the flip flop FF1 is prepared as a functional unit by the cell library 30. Thus, when performing a delaying process on an error path having the possibility of a hold time violation, a correction may be made just by changing the wiring from the Q output to the Q2 output. This differs from a case in which series-connected buffers or inverters are inserted in that designing may easily be performed within a small area.

In the preferred embodiment, the latch circuit L3 in the flip flop FF1 is used for the output delaying process. When performing a delaying process with buffers, there are many variations between different buffers. However, a delay is produced by the clock signal in a latch circuit. This ensures control of the delay. Further, a larger delay may be ensured in comparison to buffers.

It should be apparent to those skilled in the art that the present invention may be embodied in many other specific forms without departing from the spirit or scope of the invention. Particularly, it should be understood that the present invention may be embodied in the following forms.

In the preferred embodiment, a positive edge trigger type synchronous flip flop, which operates only when the clock input to the clock input terminal rises, is used. However, the present invention is not limited to such a structure. For example, a negative edge trigger type flip flop, which operates only when the clock falls, may be used instead.

In the preferred embodiment, the flip flop FF11 and the flip flop FF12 are directly connected to each other. However, the flip flop FF11 and the flip flop FF12 may be connected via a predetermined logic circuit. The logic circuit is formed by combining logic operators (e.g., inverter, adder, counter, multiplier, and shifter).

The present examples and embodiments are to be considered as illustrative and not restrictive, and the invention is not to be limited to the details given herein, but may be modified within the scope and equivalence of the appended claims.

What is claimed is:

1. A method for designing a semiconductor integrated circuit using a cell library that stores standard cells used for designing the integrated circuit, wherein the standard cells include a flip flop function device having a data input terminal, a clock input terminal and first and second data output terminals, the flip flop function device including, a first latch having a data input connected to the data input terminal and a clock input connected to the clock input terminal by way of an inverter, and generating a first latch output signal, a second latch having a data input that receives the first latch output signal and a clock input connected to the clock input terminal, and generating a second latch output signal, and a third latch having a data input that receives the second latch output signal and a clock input connected to the clock input terminal by way of an inverter, and generating a third latch output signal, wherein the second latch output signal comprises the first data output terminal of the flip flop function device and the third latch output signal comprises the second data output terminal of the flip flop function device;

the method comprising the steps of:

designing a circuit by forming a data path with the standard cells, wherein interconnected flip flop function devices include a former device and a latter device wherein the first data output of the former device is connected to the data input terminal of the latter device and the second data output terminal of the former and latter devices are unconnected;

inspecting the designed circuit for potential hold time violations in data paths of interconnected flip flop function devices therein; and correcting any detected potential hold time violations in said data paths by disconnecting the first data output terminal of the former device that is connected to the data input of the latter device, and connecting the second data output terminal of the former device to the data input terminal of the latter device.

2. The method for designing a semiconductor integrated circuit according to claim 1, further comprising:

inspecting the designed circuit for potential set up time violations in data paths of interconnected flip flop function devices therein; and correcting the detected potential set up time violations by reducing the number of logic gates between interconnected flip flop functions devices in said data paths.

3. An apparatus for designing a semiconductor integrated circuit, comprising:

a cell library that stores standard cells used for designing the integrated circuit, wherein the standard cells include a flip flop function device having a data input terminal, a clock input terminal and first and second data output terminals, the flip flop function device including, a first latch having a data input connected to the data input terminal and a clock input connected to the clock input terminal by way of an inverter, and generating a first latch output signal, a second latch having a data input that receives the first latch output signal and a clock input connected to the clock input terminal, and generating a second latch output signal, and a third latch having a data input that receives the second latch output signal and a clock input connected to the clock input terminal by way of an inverter, and generating a third latch output signal, wherein the second latch output signal comprises the first data output terminal of the flip flop function device and the third latch output signal comprises the second data output terminal of the flip flop function device;

a net list data storage device that stores net list data related to the function and structure of the integrated circuit as described with a hardware description language;

a design processing means for generating a gate level integrated circuit design using the net list data and the standard cells stored in the cell library, wherein interconnected flip flop function devices are connected by connecting the first data output terminal of a former device to the data input terminal of a latter device, and wherein the second data output terminals of the flip flop function devices are not connected with other devices;

a hold time inspection unit for simulating the integrated circuit using the net list, and detecting potential hold time violations in data paths of interconnected flip flop function devices therein, wherein the data paths with detected hold time violations include a former flip flop function device and a latter flip flop function device and a data path correcting means for correcting the detected potential hold time violations in said data paths by disconnecting the first data output terminal of the former device that is connected to the data input of the latter device, and connecting the second data output terminal of the former device to the data input terminal of the latter device.

4. The apparatus for designing a semiconductor integrated circuit of claim 3, further comprising:

a set up time inspection unit for simulating the integrated circuit using the net list, and detecting potential set up time violations in data paths of interconnected flip flop function devices therein, wherein the data paths with detected set up time violations include a former flip flop function device and a latter flip flop function device and a number of logic gates connected between the former and latter devices; and wherein the data path correcting means corrects detected potential set up time violation by reducing the number of logic gates connected between the former and latter devices.

* * * * *